(12) United States Patent
Li et al.

(10) Patent No.: US 7,830,434 B2
(45) Date of Patent: Nov. 9, 2010

(54) SEMICONDUCTOR COLOR IMAGE SENSOR RESPONSIVE AT SHORTER WAVELENGTHS

(75) Inventors: Yi-Qun Li, Danville, CA (US); Shifan Cheng, Dublin, CA (US); Magnus Ryde, Atherton, CA (US); Mike Ko, Fremont, CA (US)

(73) Assignee: Intematix Corporation, Fremont, CA (US)

( * ) Notice: Subject to any disclaimer, the term of this patent is extended or adjusted under 35 U.S.C. 154(b) by 613 days.

(21) Appl. No.: 11/893,129

(22) Filed: Aug. 13, 2007

(65) Prior Publication Data

US 2008/0043129 A1  Feb. 21, 2008

Related U.S. Application Data

(60) Provisional application No. 60/838,484, filed on Aug. 16, 2006.

(51) Int. Cl.
*H04N 5/335* (2006.01)
*G01N 23/04* (2006.01)

(52) U.S. Cl. ..................... 348/294; 250/581

(58) Field of Classification Search ............. 348/32–34, 348/294, 308, 311; 250/370.08, 483.1, 486.1, 250/487.1, 581, 582, 584
See application file for complete search history.

(56) References Cited

U.S. PATENT DOCUMENTS 4,051,374 A * 9/1977 Drexhage et al. ...... 250/370.08
4,577,098 A * 3/1986 Ogawa .................... 250/216
5,990,506 A  11/1999 Fossum et al.
6,064,069 A * 5/2000 Nakano et al. ......... 250/370.08
6,544,438 B2  4/2003 Yocom et al.
6,597,398 B1 * 7/2003 Booth, Jr. ................ 348/272
7,075,576 B2 * 7/2006 Creasey et al. .............. 348/311
2003/0006702 A1  1/2003 Mueller-Mach et al.
2006/0027781 A1  2/2006 Dong et al.

* cited by examiner

*Primary Examiner*—Timothy J Henn
(74) *Attorney, Agent, or Firm*—Fliesler Meyer LLP

(57) ABSTRACT

A semiconductor color image sensor comprises: an array of semiconductor photo-sensors (CMOS or CCD) and a color filter array comprising an array of red, green and blue filter elements in which each filter element is associated with a respective one of the photo-sensors. The sensor further comprises a phosphor (photo-luminescent) material associated with each of the blue filter elements and configured to absorb blue light and re-emit light of a longer wavelength range which is then incident on the photo-sensor associated with the blue filter element. Preferably the phosphor material is selected such that light of the longer wavelength range substantially matches the spectral response of the photo-sensor. The image sensor can further comprise an array of micro-lenses for focusing light onto the photo-sensors of the image sensor, wherein each micro-lens is associated with a respective one of the photo-sensors.

16 Claims, 8 Drawing Sheets

SEMICONDUCTOR COLOR IMAGE SENSOR RESPONSIVE AT SHORTER WAVELENGTHS

CROSS REFERENCE TO RELATED APPLICATION

This application claims the benefit of priority to U.S. Provisional Patent Application No. 60/838,484, filed Aug. 16, 2006, the specification and drawings of which are incorporated herein by reference.

BACKGROUND OF THE INVENTION

1. Field of the Invention

The present invention relates to semiconductor color image sensors such as CCD (Charge Coupled Devices) and CMOS (Complementary Metal Oxide Semiconductor) image sensors. In particular the invention concerns improvements in or relating to the response of such sensors at shorter wavelengths.

2. Description of the Related Art

As is known semiconductor image sensors comprise an array of semiconductor photo-sensors which measure the intensity of light incident on them. In a color image sensor the contribution of red (R), green (G) and blue (B) light components are measured for each pixel of the image using a color filter array (CFA) which comprises an array of red, green and blue optical bandpass filters. Individual filter elements of the CFA overlie a respective photo-sensor such that each photo-sensor measures light intensity for a given color of light. In such image sensors a single image pixel thus comprises at least three photo-sensors for measuring red, green and blue light contributions. A partially exploded schematic representation of a color image sensor 10 is shown in FIG. 1 and comprises a photo-sensor array 12, a CFA 14 and an array of micro-lenses 16.

Many color image sensors utilize a Bayer Pattern mosaic CFA in which there are twice as many green filters as there are red and blue filters. This concept is illustrated in FIG. 2 in which the CFA 20 has in a first row 22 a pattern which alternates between red and green filters, and in a second row 24 a pattern which alternates between green and blue filters. The need for having twice as many green filters as either red or blue filters is because the human eye is more sensitive to green light than to the other two colors of light. Thus, the accuracy of green in a color image is more important. Since a color filter 14A, 14B, 14C in the CFA layer 14 (FIG. 1) covers a respective photo-sensor 12A, 12B, 12C of the sensor array 12, only light that is transmitted by the filter may be absorbed and detected by that particular photo-sensor. Sometimes an array of micro-lenses 16 is provided on top of the CFA with a respective micro-lens 16A, 16B, 16C overlying an associated photo-sensor to collect and focus more radiation, thus increasing the sensitivity of the image sensor.

Typical image sensor technologies such as those based on charge coupled devices (CCDs) and complimentary metal oxide semiconductors (CMOS) are less responsive to light in the shorter (i.e. blue and violet) wavelength regions of the visible spectrum compared to the red and green regions of the spectrum. This can in part be due to the high absorption of these wavelengths by the lens material. Additionally, there may a limited penetration depth of this shorter wavelength light in silicon. Unfortunately, much of the radiation is absorbed at the polysilicon gate region, with very little penetrating into the channel regions of the photo-sensor where the photoelectric signal is generated.

There has been a variety of attempts made in the prior art to alleviate these problems. Some of these attempts have made use of structural modifications that include back-side illuminating thinned devices, pinned photodiodes, and indium tin oxide (ITO) gated CCD sensors. These approaches have achieved relatively good results in terms of short wavelength spectral response, but at the high cost of complicated fabrication. This problem has become a bottleneck to a continuing improvement of dark sensitivity and the color quality of today's digital color cameras which demand inexpensive image sensors.

SUMMARY OF THE INVENTION

The object of the invention is to provide a color image sensor which at least in part has an improved sensitivity at shorter wavelengths of the visible spectrum. Embodiments of the invention are based on converting blue light transmitted by a blue filter into longer wavelengths ranging from green to red or even near infra red (IR), for which silicon detectors have an optimum sensitivity. This is achieved through the use of a phosphor material (photo-luminescent or wavelength conversion) material to absorb shorter wavelength radiation (light) and re-emit radiation of a longer wavelength at which the sensor is more responsive. By using a phosphor material as a spectral shifter (wavelength converter) it is possible to better match the maximum spectral response (the peak of quantum efficiency) of photo-sensor and thereby greatly enhances the performance of the image sensor.

Many green, yellow, and red phosphors have been developed for the converting blue light generated by blue LEDs to white light and/or other colors, and these can be utilized in the present invention for efficiently shifting shorter wavelength light, namely blue light, to longer wavelengths before that radiation reaches the silicone detector area addressed for (or assigned to) blue part of the pixel. A variety of thin layer processing methods can be used to apply the blue light excited phosphor layer between blue filters and the blue addressed silicone detectors.

According to the invention a semiconductor color image sensor comprises: an array of semiconductor photo-sensors; a color filter array comprising an array of red, green and blue filter elements in which each filter element is associated with a respective one of the photo-sensors; and at least one phosphor material associated with each of the blue filter elements and configured to absorb blue light and re-emit light of a longer wavelength range which is then incident on the photo-sensor associated with the blue filter element.

Advantageously, the phosphor material is selected such that light of the longer wavelength range substantially matches the spectral response of the photo-sensors.

The image sensor can further comprise an array of micro-lenses for focusing light onto the photo-sensors of the image sensor, wherein each micro-lens is associated with a respective one of the photo-sensors.

In one embodiment the image sensor further comprises a wavelength selective layer interposed between the blue filter element and the at least one phosphor material, said wavelength selective layer being substantially transparent to blue light and substantially reflective to light of said longer wavelength range. Such a filter improves the sensor sensitivity by re-directing the longer wavelength light in a direction toward the associated photo-sensor.

The at least one phosphor material can be provided on the blue filter elements of the color filter array in the form of one or more layers. Alternatively, the at least one phosphor is provided on the photo-sensors associated with blue filter elements of the color filter array in the form of one or more layers.

Preferably the color filter array comprise a Bayer pattern of color filter elements in which there are twice as many green filter elements as there are red and blue filter elements.

The phosphor material can comprise any suitable inorganic phosphor material and can comprise for example an aluminate or silicate-based phosphor materials. In one embodiment the at least one phosphor material can comprise a green-yellow silicate-based phosphor of general formula $(SrM1)_2Si(OD)_4$:Eu in which M1 is Ba, Ca, Mg or Zn and D is F, Cl, S or N and which is configured to emit light in a wavelength range 520 to 575 nm.

In another embodiment the at least one phosphor material can comprise an orange-red silicate-based phosphor of general formula $(SrM1)_3Si(OD)_5$:Eu in which M1 is Ba, Ca, Mg or Zn and D is F, Cl, S or N and which is configured to emit light in a wavelength range 580 to 630 nm.

In a further embodiment the at least one phosphor material can comprise a green-yellow yttrium aluminates garnet based phosphor of general formula $(YM1)_3(AlM2)_5O_{12}$ in which M1 is Tb, Gd, Sm or La and M2 is Ga or In and which is configured to emit light in a wavelength range 540 to 580 nm.

In a yet further embodiment the at least one phosphor material can comprise a red silicon nitride based phosphor of general formula $(SrM1)Si_5N_8$ in which M1 is Sr, Ca, Mg or Zn and which is configured to emit light in a wavelength range 590 to 700 nm.

In a still yet further embodiment the at least one phosphor material can comprise a red sulfate based phosphor of general formula $(SrM1)S$ in which M1 is Ca, Ba or Mg and which is configured to emit light in a wavelength range 600 to 650 nm.

In another further embodiment the at least one phosphor material can comprise a green sulfate based phosphor of general formula $(SrM1)(GaM2)_2S_4$:Eu in which M1 is Ca, Ba or Mg and M2 is Al or In and which is configured to emit light in a wavelength range 520 to 550 nm.

The image sensor of the invention finds particular application in which the array of semiconductor photo-sensors comprises a Complementary Metal Oxide Semiconductor (CMOS) device or charge coupled Device (CCD).

In a further embodiment the image sensor further comprises at least one phosphor material associated with each of the green filter elements and configured to absorb green light and re-emit light of a longer wavelength range which is then incident on the photo-sensor associated with the green filter element. Additionally, the image sensor can further comprise at least one phosphor material associated with each of the red filter elements and configured to absorb red light and re-emit light of a longer wavelength range which is then incident on the photo-sensor associated with the red filter element.

BRIEF DESCRIPTION OF THE DRAWINGS

In order that the present invention is better understood embodiments of the invention will now be described, by way of example only, with reference to the accompanying drawings in which.

DETAILED DESCRIPTION OF THE INVENTION

Figure 1:
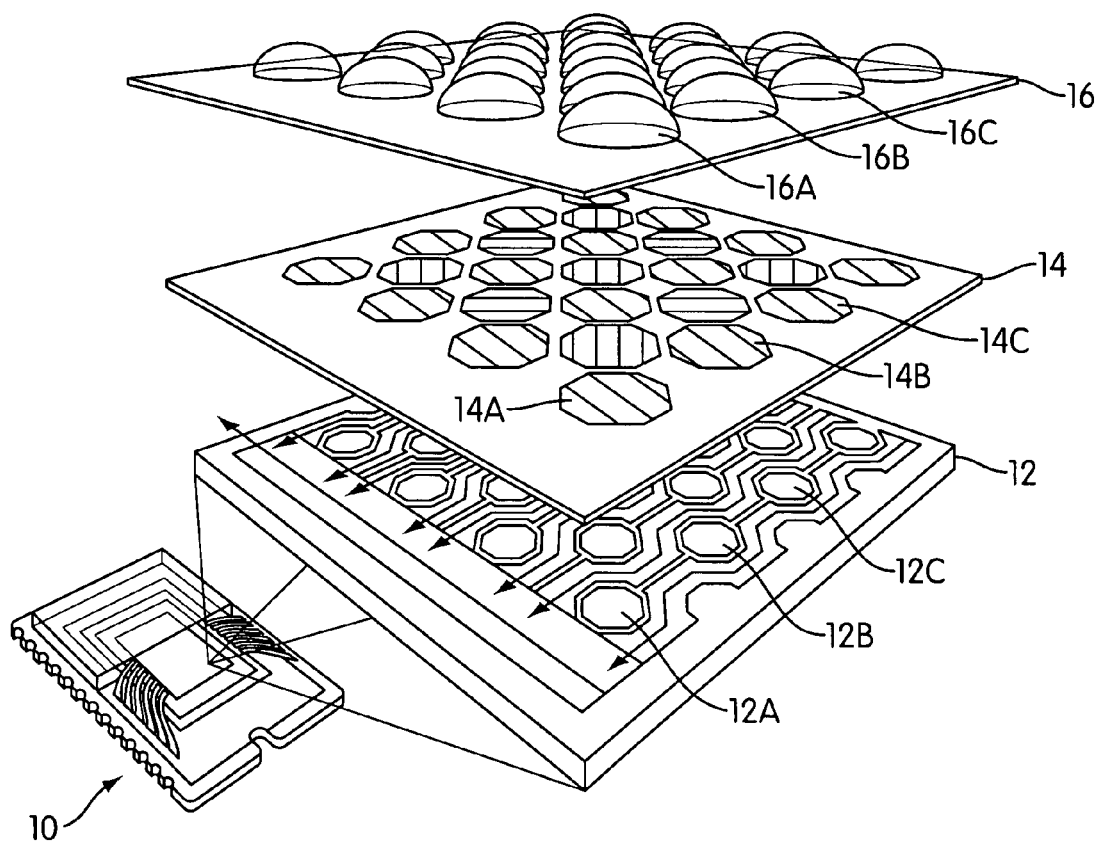
FIG. 1 is a partially exploded schematic representation of a prior art color image sensor.
Figure 2:
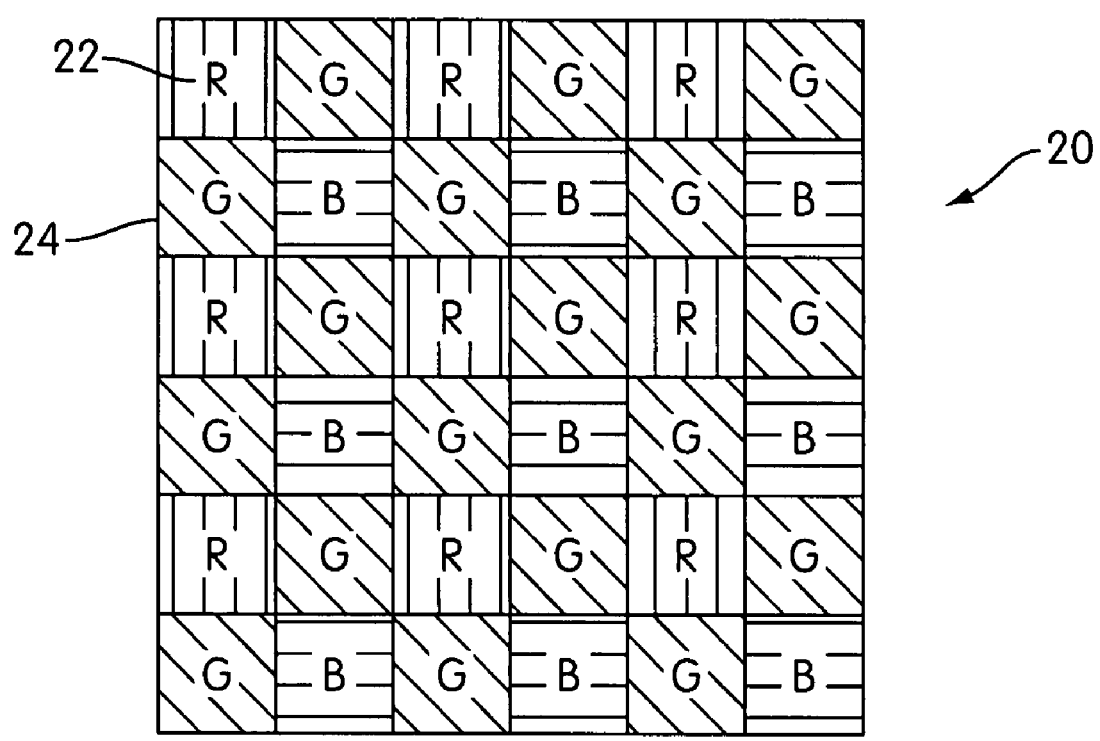
FIG. 2 is a schematic representation of a Bayer Filter mosaic color filter array (CFA)
Figure 3:
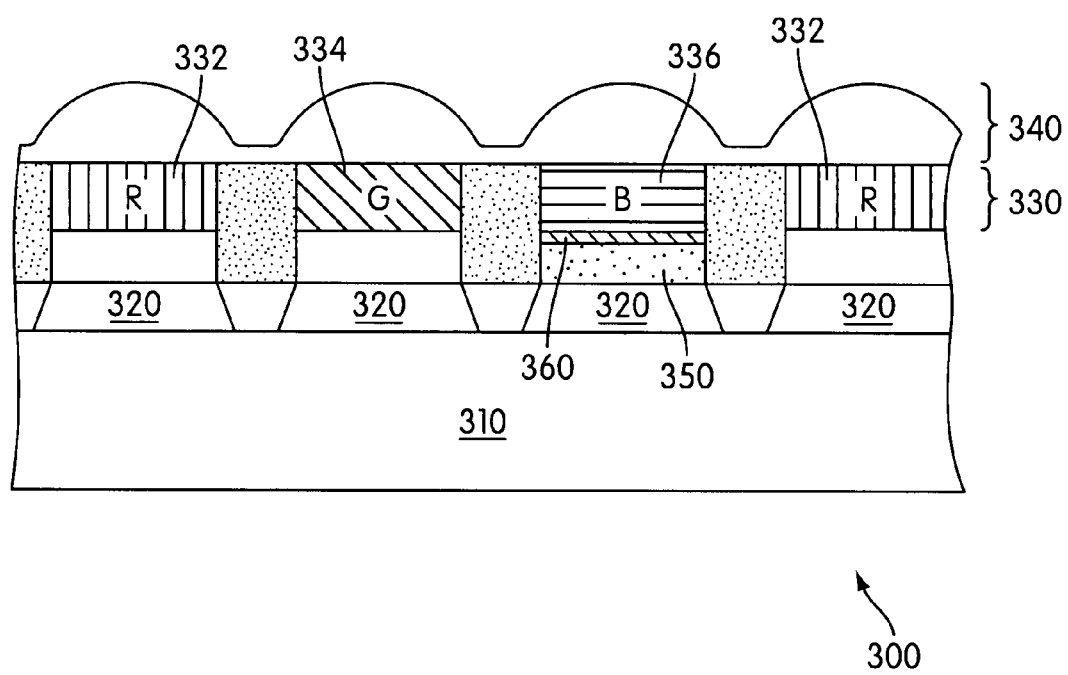
FIG. 3 schematic representation of a color image sensor in accordance with the invention.

Referring to FIG. 3 there is a shown a schematic representation of a color image sensor 300 in accordance with the invention. As with the known color image sensors, the image sensor of the present invention comprises a substrate 310, typically silicon, having on an upper surface thereof an array of photo-sensors 320. The photo-sensors 320 can comprises Complementary Metal Oxide Semiconductor (CMOS) devices, Charge Coupled Devices (CCD) or other photodetector known in the art. A color filter array (CFA) 330 is provided on top of the array of photo-sensors and comprises an array of red (R) 332, green (G) 334 and blue (B) 336 filter elements. As is known the CFA 330 is configured such that a respective filter element overlies an associated photo-sensor 320. The CFA can comprise a Bayer mosaic pattern of red, green and blue filter elements in which there are twice as many green filter elements as there are red and blue filter elements as for example illustrated in FIG. 2. Each filter element comprises an optical bandpass filter in which the red, green and blue filter element characteristics are selected such that they have overlapping characteristics covering the visible spectrum. The construction of such filters is well known in the art and is accordingly not described further. Optionally an array of micro-lenses 340 in which each micro-lens is associated with a respective one of the photo-sensors.

In contrast to the known color image sensors the image sensor of the present invention further comprises a phosphor material 350 associated with each of the blue filter elements 336. The phosphor material is provided as a layer overlying the light sensitive surface of the associated photo-sensor and can be deposited directly onto the photo-sensors or onto the blue filter elements 336 of the CFA 330. As is known phosphor (photo-luminescent or wavelength conversion) materials absorb radiation of one wavelength and re-emit radiation of a longer wavelength. In operation the phosphor material absorbs light transmitted by the blue filter elements and re-emits light of a longer wavelength, for example green, yellow orange or near IR, which is detected by the associated photo-sensor.

Typically, phosphors are chemical compositions in which rare earth elements are used to dope a crystalline host material. The emission wavelength of the phosphor may be tuned by both the host material and the particular selection of the rare earth dopant. The emission wavelength of the phosphor is in part determined by electron-phonon interactions (e.g., lattice vibrations) associated with the local crystal field of the phosphor. By choosing a phosphor that has strong absorption of nearly all the light of a wavelengths smaller than its absorption edge (e.g., higher energy), the phosphor acts as spectral shifter (wavelength-converter) by re-emitting photons in a longer wavelength range (e.g., lower energy) that better match the spectral response of the photo-sensor. In particular, it is the maximum of the spectral response whose matching is desired. The lower energies, and/or longer wavelengths that are desired lie in the near infrared (IR) region of the electromagnetic spectrum for conventional CCD and CMOS image sensors. Since the photo-sensor optimum response lies in the near IR the color image sensor of the invention can further include an IR blocking filter to prevent the photo-sensors being saturated by IR radiation. The IR blocking filter can be incorporated into the CFA, provided as a separate filter element or combined in the micro-lens array.

In one embodiment the phosphor 350 has the property of absorbing the blue-violet portion of visible light and re-radiating at least a portion of this energy as luminescence in the near IR region. The re-radiated luminescence may have a relatively broad emission having a peak around 780 to 900 nm; this is the region where silicon-based CCD or CMOS image sensors normally have their maximum spectral response. Often, this response may be over about 90 percent quantum efficiency.

It may be desirable to have the conversion efficiency of the phosphor as close to 100 percent as possible. The isotropic nature of phosphor luminescence implies that the phosphor will emit about 50 percent of its radiation in a direction away from the photo-sensor. Fortunately, a fraction of this portion of the emitted luminescence of the phosphor may be redirected towards the sensor through total internal reflection at the phosphor layer and air interface. The amount of the luminescence to be recovered may be up to 20 to 25 percent, depending on the design of the optics. This embodiment can lead to an overall improvement of more than about 20 percent in the spectral response of the color image sensor. To further assist in directly light generated by the phosphor towards its associated photo-sensor the image sensor can further include a wavelength selective layer interposed between the blue filter element and the at least one phosphor material, the wavelength selective layer being substantially transparent to blue light and substantially reflective to light of said longer wavelength range.

It is important to note that the encoded color signal(s) from an array of color image photo-sensors do not convey any real wavelength information relative to the original hue. For example, if a predominantly orange color is imaged the red photo-sensor will detect the light as an intensity of red light only. However, the green photo-sensor will also detect some part of this orange light and measure the intensity of what is essentially green light. This color measuring system only works because the optical color filter elements are bandpass filters in nature, and thus posses a finite selectivity. If they were discrete essentially monochromatic filters, the color imaging system would fail. This phenomenon highlights the ratio-metric nature of the imaging system; i.e., the overlapping and gradual gradation of the color filter elements; all three filter elements having a known weighted proportion of the visible spectrum.

Figure 4:
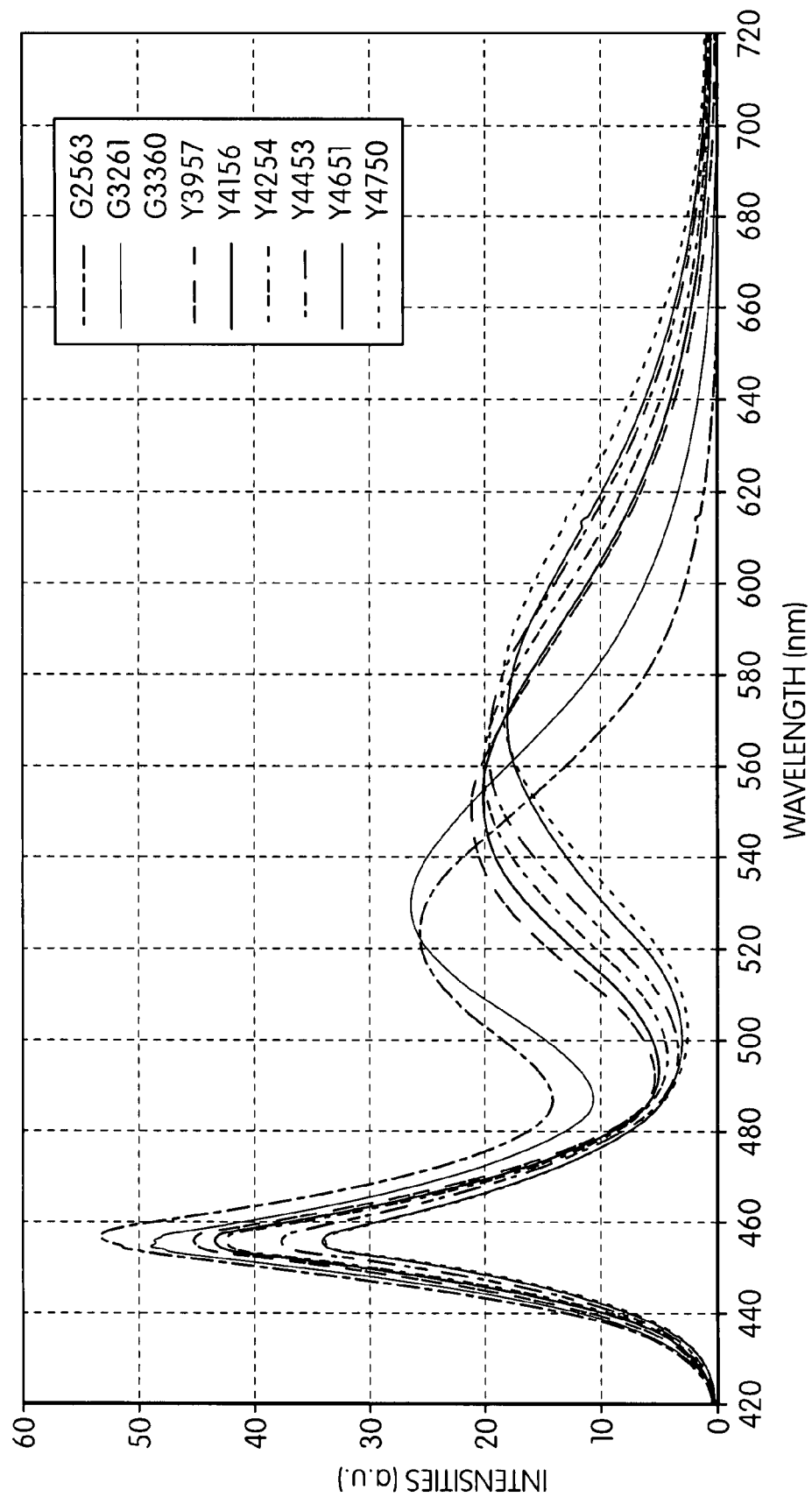
FIG. 4 shows the emission spectra for Intematix Corporation's green-yellow silicate phosphors G2563, G3261, G3360, Y3957, Y4156, Y4254, Y4453, Y4651 and Y4750 under blue LED excitation at peak emission wavelengths of 450 nm.

In one embodiment the phosphor material comprises a green-yellow silicate-based phosphor of general formula $(SrM1)_2Si(OD)_4$:Eu in which M1 is Ba (Barium), Ca (Calcium), Mg (Magnesium) or Zn (Zinc) and D is F (Fluorine), Cl (Chlorine), S (Sulfur) or N (Nitrogen) and which is configured to emit light in a wavelength range 520 to 575 nm. FIG. 4 shows the emission spectra for nine such phosphors under blue LED excitation at peak emission wavelengths of 450 nm. The Figure is for phosphors produced by Intematix Corporation of Fremont, Calif., USA and the phosphor name, e.g. G2563, in which the initial letter indicates the color (e.g. G for green) and the numbers are the chromaticity CIE (x, y) coordinates for the emission peak.

Figure 5:
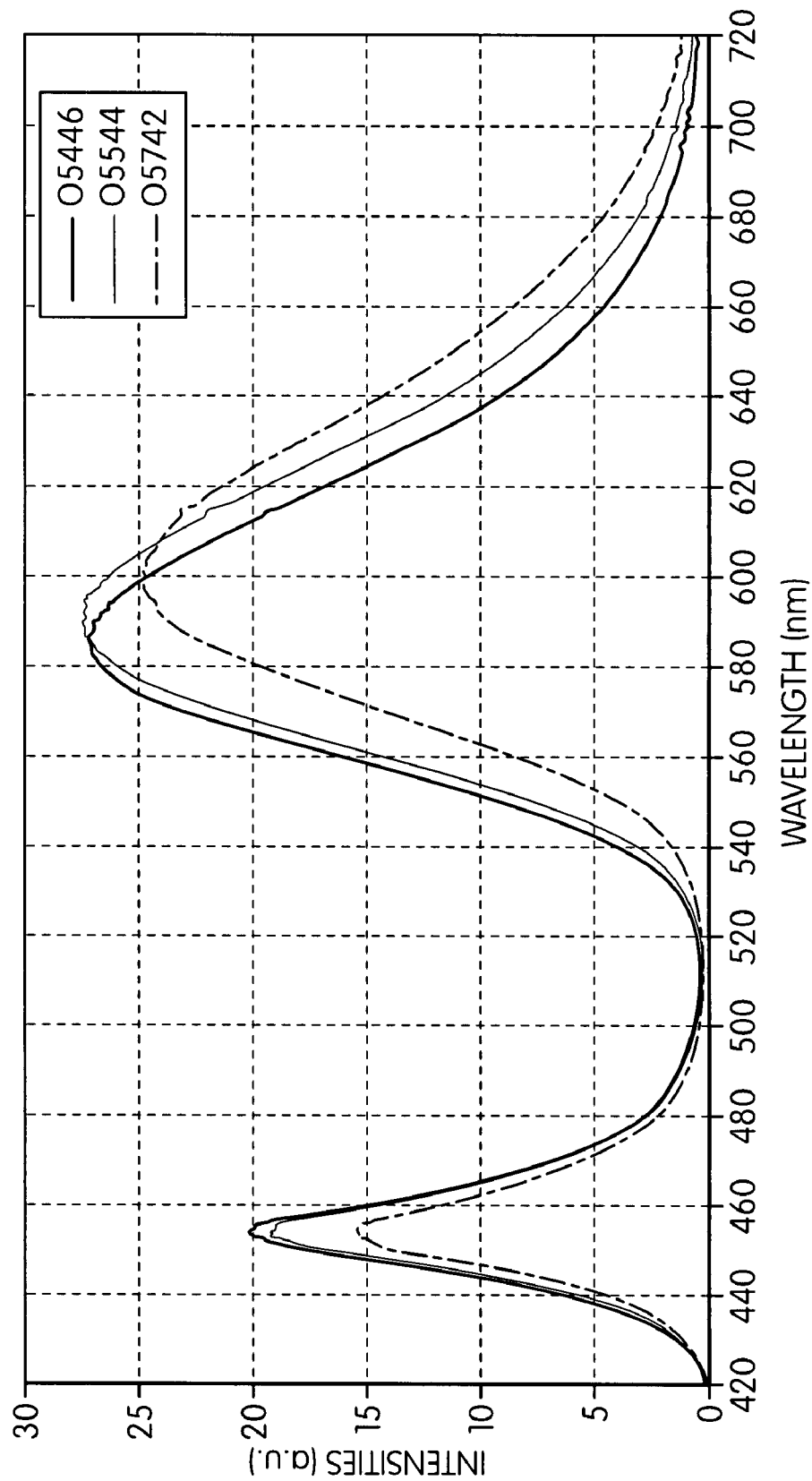
FIG. 5 shows the emission spectra for Intematix Corporation's orange-red silicate phosphors O5446, O5544 and O5742 under blue LED excitation at peak emission wavelengths of 450 nm.

In another embodiment the at least one phosphor material can comprise an orange-red strontium (Sr) silicate-based phosphor of general formula $(SrM1)_3Si(OD)_5$:Eu in which M1 is Ba, Ca, Mg or Zn and D is F, Cl, S or N and which is configured to emit light in a wavelength range 580 to 630 nm. FIG. 5 shows the emission spectra for three such phosphors under blue LED excitation at peak emission wavelengths of 450 nm.

Figure 6:
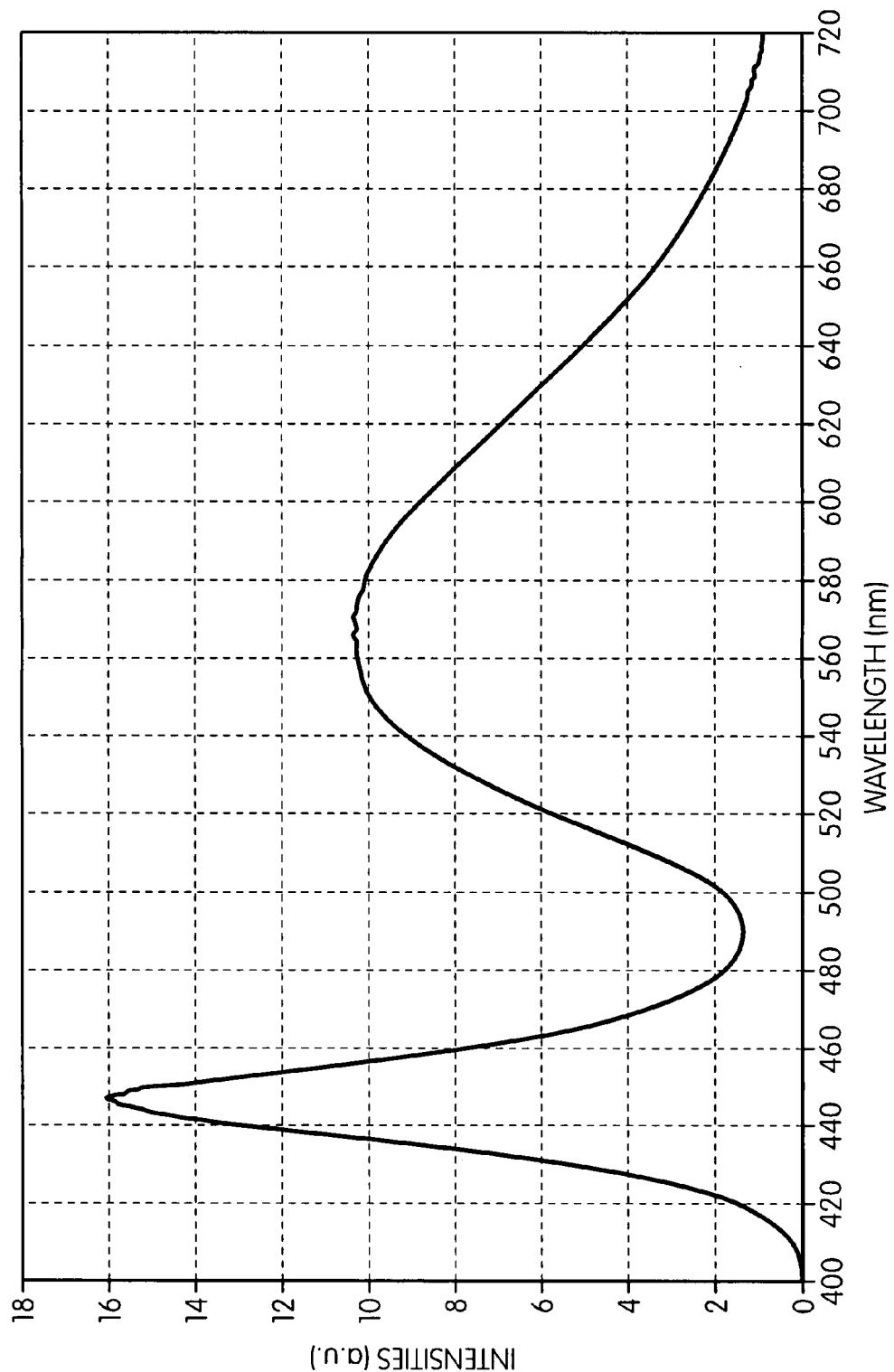
FIG. 6 shows the emission spectrum of a yellow YAG phosphor under blue LED excitation at peak emission wavelengths of 460 nm.

In a further embodiment the at least one phosphor material can comprise a green-yellow yttrium (Y) aluminates garnet based phosphor of general formula $(YM1)_3(AlM2)_5O_{12}$ in which M1 is Tb (Terbium), Gd (Gadolinium), Sm (Samarium) or La (Lanthanum) and M2 is Ga (Gallium) or In (Indium) and which is configured to emit light in a wavelength range 540 to 580 nm. FIG. 6 shows the emission spectrum of such a phosphor under blue LED excitation at peak emission wavelengths of 460 nm.

Figure 7:
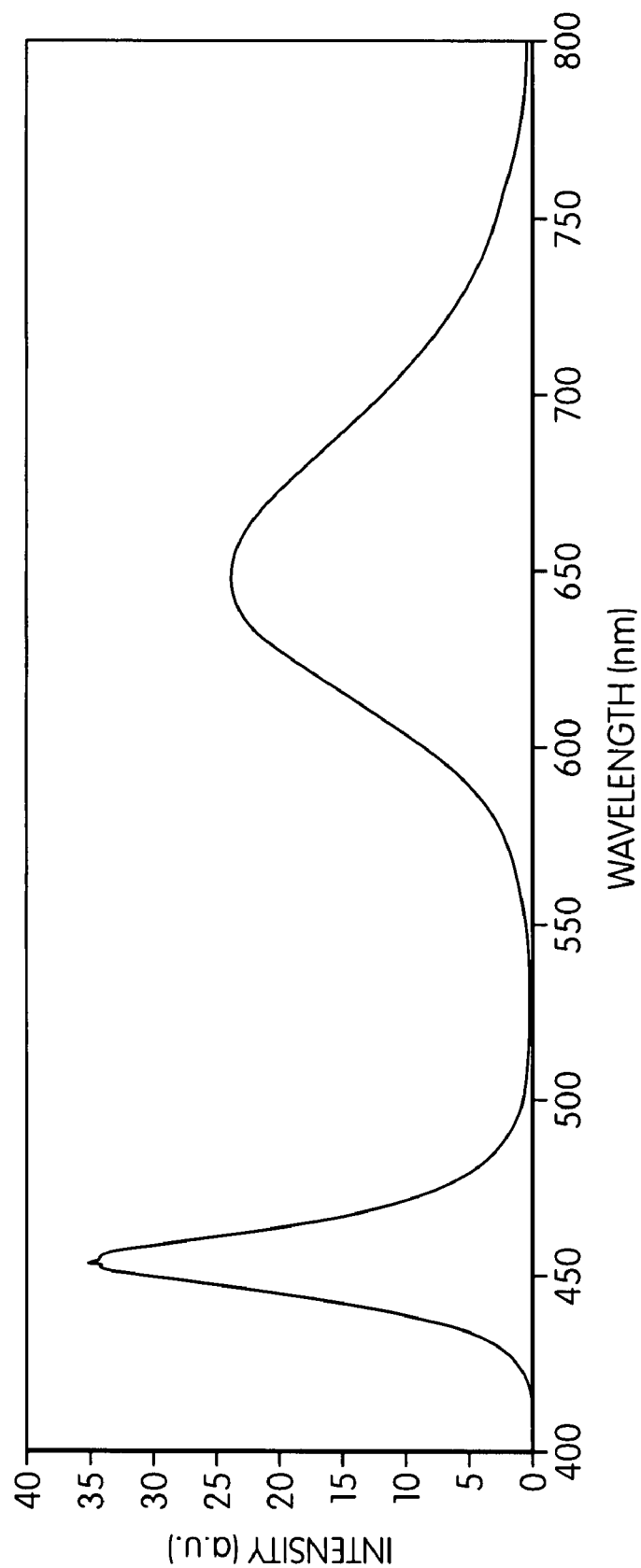
FIG. 7 shows the emission spectrum of a red silicon nitride phosphor under blue LED excitation at peak emission wavelengths of 450 nm.

In a yet further embodiment the at least one phosphor material can comprise a red silicon nitride based phosphor of general formula $(SrM1)Si_5N_8$ in which M1 is Sr, Ca, Mg or Zn and which is configured to emit light in a wavelength range 590 to 700 nm. FIG. 7 shows the emission spectrum of such a phosphor under blue LED excitation at peak emission wavelengths of 450 nm.

Figure 8:
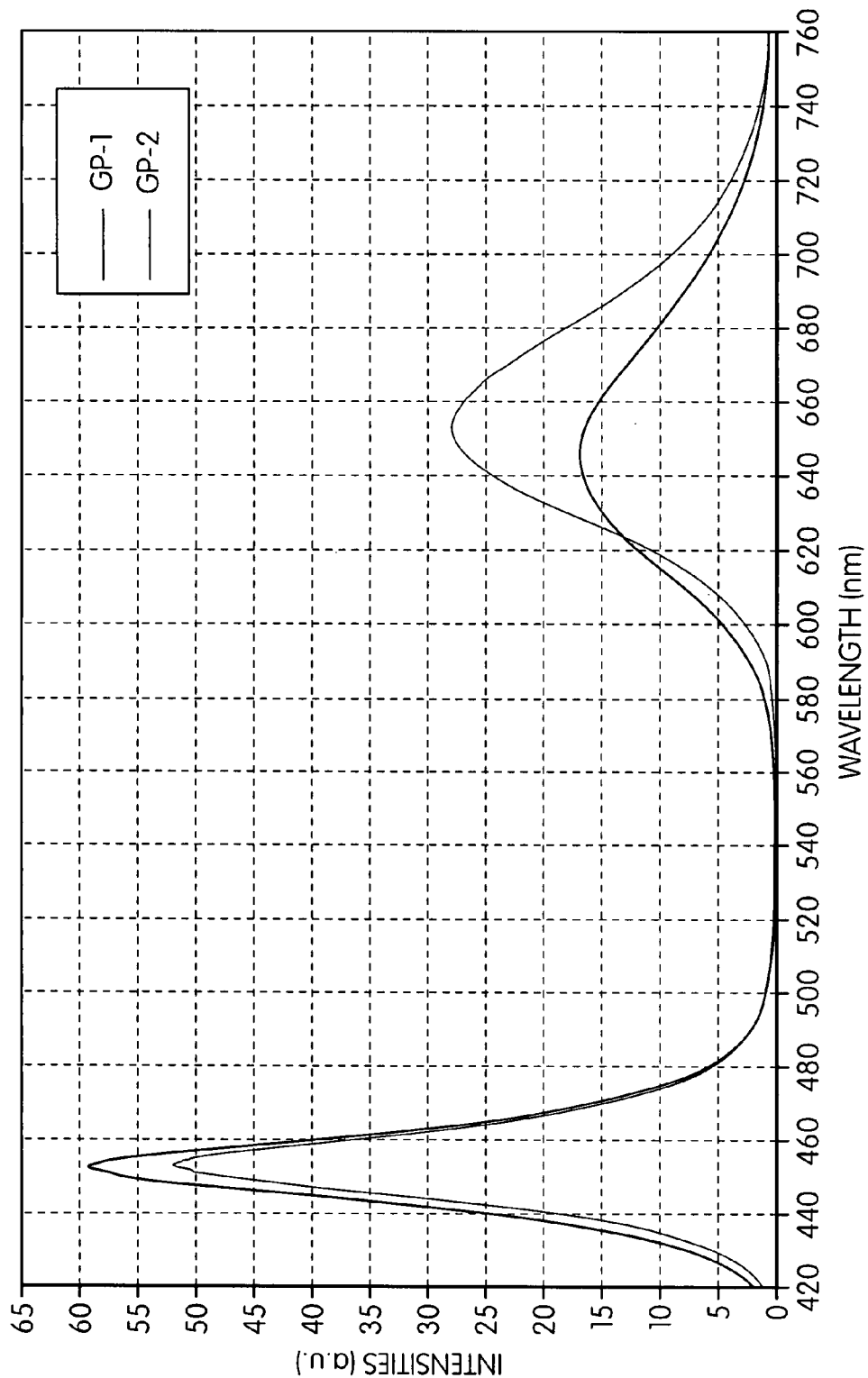
FIG. 8 shows the emission spectrum of a red sulfate phosphor under blue LED excitation at peak emission wavelengths of 450 nm.

In a still yet further embodiment the at least one phosphor material can comprise a red sulfate based phosphor of general formula $(SrM1)S$ in which M1 is Ca, Ba or Mg and which is configured to emit light in a wavelength range 600 to 650 nm. FIG. 8 shows the emission spectrum for two such phosphors under blue LED excitation at peak emission wavelengths of 450 nm.

In another further embodiment the at least one phosphor material can comprise a green sulfate based phosphor of general formula $(SrM1)(GaM2)_2S_4$:Eu in which M1 is Ca, Ba or Mg and M2 is Al or In and which is configured to emit light in a wavelength range 520 to 550 nm.

It will be appreciated that the present invention is not restricted to the specific embodiments described and that variations can be made that are within the scope of the invention. For example, in other embodiments phosphor materials can be included for the green and/or red filter elements to optimize the image sensors response for these wavelengths too.

What is claimed is:

1. A semiconductor color image sensor comprising: an array of semiconductor photo-sensors; a color filter array comprising an array of red, green and blue filter elements in which each filter element is associated with a respective one of the photo-sensors; and at least one phosphor material associated with each of the blue filter elements and configured to absorb blue light and re-emit light of a longer wavelength range which is then incident on the photo-sensor associated with the blue filter element, wherein the at least one phosphor is provided as a layer overlying the blue filter elements of the color filter array.

2. The image sensor according to claim 1, wherein the phosphor material is selected such that light of the longer wavelength range substantially matches the spectral response of the photo-sensor.

3. The image sensor of claim 1, and further comprising an array of micro-lenses for focusing light onto the photo-sensors of the image sensor, wherein each micro-lens is associated with a respective one of the photo-sensors.

4. The image sensor of claim 1, and further comprising a wavelength selective layer interposed between the blue filter element and the at least one phosphor material, said wavelength selective layer being substantially transparent to blue light and substantially reflective to light of said longer wavelength range.

5. The image sensor of claim 1, wherein the color filter array comprise a Bayer pattern of color filter elements.

6. The image sensor of claim 1, wherein the phosphor material comprises a composition selected from the group consisting of: aluminate and silicate-based phosphors.

7. The image sensor of claim 1, wherein the at least one phosphor material comprises a green-yellow silicate-based phosphor of general formula $(SrM1)_2Si(OD)_4$:Eu in which M1 is Ba, Ca, Mg or Zn and D is F, Cl, S or N and which is configured to emit light in a wavelength range 520 to 575 nm.

8. The image sensor of claim 1, wherein the at least one phosphor material comprises an orange-red silicate-based phosphor of general formula $(SrM1)_3Si(OD)_5$:Eu in which M1 is Ba, Ca, Mg or Zn and D is F, Cl, S or N and which is configured to emit light in a wavelength range 580 to 630 nm.

9. The image sensor of claim 1, wherein the at least one phosphor material comprises a green-yellow yttrium aluminates garnet based phosphor of general formula $(YM1)_3(AlM2)_5O_{12}$ in which M1 is Tb, Gd, Sm or La and M2 is Ga or In and which is configured to emit light in a wavelength range 540 to 580 nm.

10. The image sensor of claim 1, wherein the at least one phosphor material comprises a red silicon nitride based phosphor of general formula $(SrM1)Si_5N_8$ in which M1 is Sr, Ca, Mg or Zn and which is configured to emit light in a wavelength range 590 to 700 nm.

11. The image sensor of claim 1, wherein the at least one phosphor material comprises a red sulfate based phosphor of general formula $(SrM1)S$ in which M1 is Ca, Ba or Mg and which is configured to emit light in a wavelength range 600 to 650 nm.

12. The image sensor of claim 1, wherein the at least one phosphor material comprises a green sulfate based phosphor of general formula $(SrM1)(GaM2)_2S_4$:Eu in which M1 is Ca, Ba or Mg and M2 is Al or In and which is configured to emit light in a wavelength range 520 to 550 nm.

13. The image sensor of claim 1, wherein the array of semiconductor photo-sensors comprises a Complementary Metal Oxide Semiconductor (CMOS) device.

14. The image sensor of claim 1, wherein the array of semiconductor photo-sensors comprises a charge coupled Device (CCD).

15. The image sensor of claim 1, and further comprising at least one phosphor material associated with each of the green filter elements and configured to absorb green light and re-emit light of a longer wavelength range which is then incident on the photo-sensor associated with the green filter element.

16. The image sensor of claim 1, and further comprising at least one phosphor material associated with each of the red filter elements and configured to absorb red light and re-emit light of a longer wavelength range which is then incident on the photo-sensor associated with the red filter element.

* * * * *